United States Patent [19]
Kucharewski

[11] 3,973,222
[45] Aug. 3, 1976

[54] ASTABLE MULTIVIBRATOR CIRCUIT

[75] Inventor: Nicholas Kucharewski, Somerset, N.J.

[73] Assignee: RCA Corporation, New York, N.Y.

[22] Filed: May 2, 1975

[21] Appl. No.: 574,022

[52] U.S. Cl. .............................. 331/111; 307/300; 331/108 D; 331/172
[51] Int. Cl.² .......................................... H03K 1/06
[58] Field of Search ............ 307/276, 300; 331/111, 331/108 D, 113, 172

[56] References Cited
UNITED STATES PATENTS

| | | |
|---|---|---|
| 3,050,636 | 8/1962 | Sommerfield ....................... 307/280 |
| 3,443,246 | 5/1969 | Brown et al. ....................... 331/113 |
| 3,587,001 | 6/1971 | Parchim ............................. 331/111 |
| 3,767,941 | 10/1973 | Crawford ........................... 307/300 |
| 3,831,102 | 8/1974 | Medal ................................ 307/300 |

*Primary Examiner*—John Kominski
*Attorney, Agent, or Firm*—H. Christoffersen; S. Cohen; K. Watov

[57] ABSTRACT

The start-up delay of an externally synchronized astable multivibrator is reduced by placing a low impedance path between ground and the base electrode of a transistor in the input circuit to the multivibrator in response to the signal which turns on the multivibrator.

7 Claims, 3 Drawing Figures

ASTABLE MULTIVIBRATOR CIRCUIT

Many forms of externally synchronized (sometimes known as gated) astable multivibrator circuits are known in the art. They can be operated over a wide range of frequencies determined by various parameters of the circuits such as the values of the impedances, capacitors and resistors, in the feedback circuits of the multivibrators.

The present inventor has found that certain of these multivibrators suffer in performance as the operating frequency is increased. He found that a phase delay is introduced between the start of the turn-on signal applied to the multivibrator to cause it to produce oscillations and the time at which the oscillations settle down to a fixed frequency. He has also discovered the reason for this phase delay, namely the concurrent charging and discharging of various parasitic capacitances in the input circuit to the multivibrator at the time the multivibrator is turned off and the subsequent discharging and charging, respectively, of the capacitances when the multivibrator is turned on, in a sense to retard the start of oscillations at the design frequency.

The solution of the present application to the problem above, according to a preferred embodiment of the invention, is to place a low impedance path between the parasitic capacitance and a point of reference potential (ground in this example), in response to the signal which turns on the multivibrator.

Figure 1:
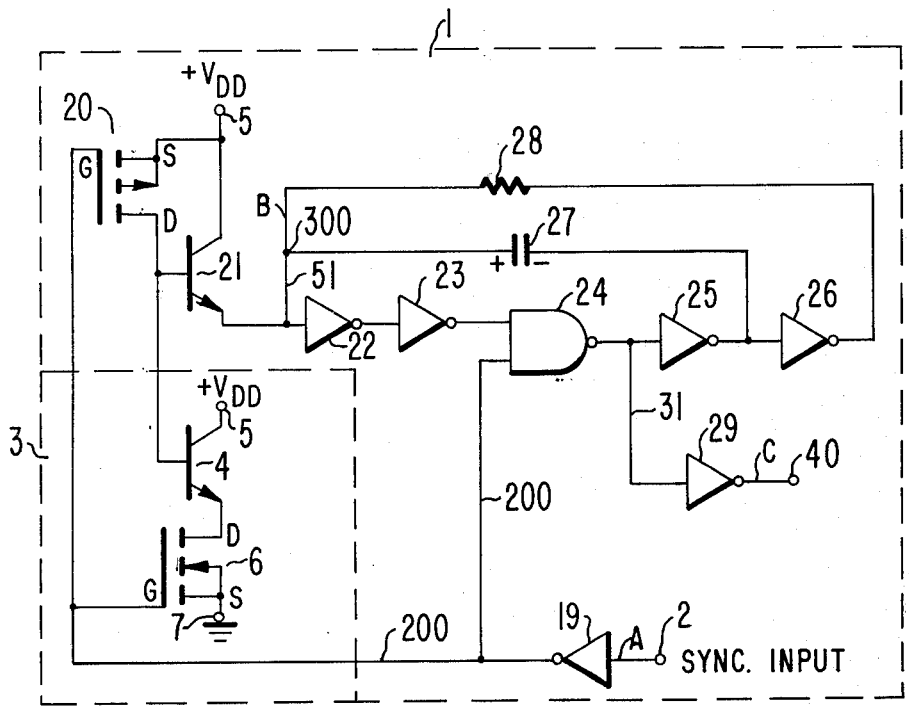
FIG. 1 is a schematic and logic diagram of a multivibrator circuit according to an embodiment of the present invention.

The portion 1 of the circuit of FIG. 1 is similar to the "oscillator section" described in U.S. Pat. No. 3,755,694 of Heuner and Paradise. The present circuit 1, includes, in addition, an inverter 19 receptive of a synchronization input signal at terminal 2 and an NPN transistor 21 connected at its collector electrode to the source electrode of transistor 20, and at its base electrode to the drain electrode of transistor 20. In the Heuner et al circuit there is simply a diode present between the drain electrode of transistor 20 and inverter 22.

Operation of the portion 1 of the circuit in the absence of elements 4 and 6 of portion 3 of the circuit will be discussed first. Assume that the synchronization input signal supplied to terminal 2 is high (represents a binary 1). The output signal from inverter 19 will be a relatively low amplitude signal representing binary zero. This low level signal applied to one of the input terminals of NAND gate 24 maintains the output signal on line 31 high regardless of the value of the second input signal to NAND gate 24, and the output signal at terminal 40 therefore remains low. The high level output signal is inverted by inverter 25, which supplies a low level signal to one side of capacitor 27 and to the input of inverter 26. Inverter 26 inverts the signal supplied thereto by inverter 25 to produce a high level output signal, which is supplied via resistor 28 both to the other side of capacitor 27 and to the input of inverter 22. Capacitor 27 is therefore charged in the polarity shown. In addition, inverter 22 produces a low level output signal, which is inverted by inverter 23 to provide a high level signal at the second input of NAND gate 24. This has no effect so long as the other input signal (on lead 200) remains low. This stable condition of circuit 1 can be considered the inactive state of the multivibrator.

The low level output signal supplied by inverter 19 is supplied to the gate electrode of PMOS transistor 20, placing this transistor 20 in its conductive state. Consequently, a relatively high signal $V_{DD}$ is supplied via the conduction path of transistors 20 and 21 of the input of inverter 22. This high level signal has the effect of clamping node 300 at $+V_{DD}$. In view of the low impedance paths from node 300 to terminal 5 via transistors 20 and 21, capacitor 27 charges quickly and the multivibrator is switched to its inactive state quickly. The charging of capacitor 27 is compatible with the feedback via resistor 28 to the capacitor.

When the synchronization input signal goes low, the circuit starts to oscillate and will remain in oscillation for as long as this input signal remains low. To start with, the output signal from inverter 19 goes high. As the second input to the NAND gate also is high, this gate produces a low level output signal. Concurrently, the high level signal supplied by inverter 19 is also applied to the gate electrode of PMOS transistor 20, whereby this device is rendered nonconductive, and transistor 21 also is cutoff. Consequently, line 51 is no longer connected to voltage source $+V_{DD}$. The low level output signal from NAND gate 24 is inverted by inverter 25, causing a high level signal to be supplied to one side of capacitor 27, in turn causing the voltage at node 300 to increase rapidly (e.g. toward $+2V_{DD}$), because the voltage across capacitor 27 cannot change instantaneously. The high level output signal from inverter 25 is also inverted by inverter 26. The resultant low level output signal from inverter 26 is applied via resistor 28 to the other side of capacitor 27 (i.e. to node 300). As a result, the voltage supplied to the input of inverter 22 via line 51 decreases as a function of the RC time constant of resistor 28 and capacitor 27. When this voltage decreases to the "critical level" (see FIG. 2), i.e. the transfer voltage of inverter 22, this signal is inverted by inverter 22, which then provides a high level output signal. The high level output signal is in turn inverted by inverter 23, providing a low level signal to one of the inputs of NAND gate 24.

As previously indicated, any low level input signal supplied to NAND gage 24, causes this gate 27 to provide a high level output signal. Consequently, a high level signal is now supplied to and inverted by inverter 25. Thus, a low level signal is applied to and inverted by inverter 26. Consequently, the signal conditions and, thus, the charge conditions at (and the voltage across) capacitor 27 reverts to the initially described conditions in accordance with the RC time constant.

Figure 2:
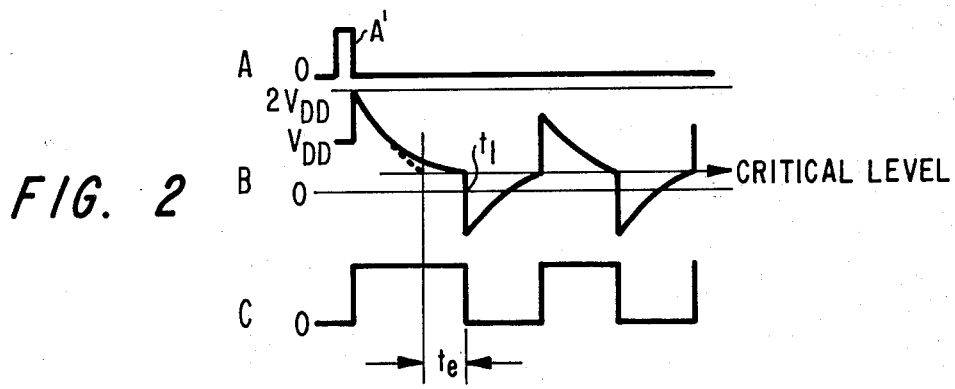
FIG. 2 is a drawing of waveforms present in the operation of the portion 1 of the circuit of FIG. 1 in the absence of the portion 3 of the circuit.

The cycling described above continues for so long as the synchronization input signal is low. The wave C at output terminal 40 and the wave B at node 300 are shown in FIG. 2. By appropriate selection of the resistor 28 and capacitor 27 values, the frequency of the circuit can be controlled. The wave B potential increases or decreases, as a function of time, with transitions at the transfer point of inverter 22. The transitions in the waveform are of amplitude $+V_{DD}$.

The present inventor has found that in the operation of the circuit 1 there is a phase delay $t_e$ during the start-up of the oscillator as shown in FIG. 2. This phase delay is not objectionable at lower frequencies; however, in some uses for the circuit it may introduce problems. In one mode of operation, for example, it may be desired to count the number of cycles which occur during a fixed turn-on period. Assuming $t_e$ remains fixed, as the oscillating frequency gets higher this period $t_e$ will correspond to the "drop-out" of a higher and higher numbers of cycles from the count being made during the turn-on period. In other modes of operation, it is important that the oscillations be synchronous with other signals in the system and the greater the delay interval $t_e$ with respect to one period of the oscillations, the greater the loss of synchronization. (Assuming $t_e$ is fixed, as the frequency increases, the greater the ratio of $t_e$ to one period.)

The present inventor has discovered that the phase delay $t_e$ is due primarily to parasitic capacitances connected at one end to the base electrode of NPN transistor 21. These capacitances include the diffusion capacitance of the PMOS transistor 20, the metal interconnect capacitance between the drain of the PMOS transistor 20 and the base of NPN transistor 21, the inherent base-emitter capacitance of transistor 21 and possibly other capacitances. The inventor believes that the major portion of this capacitance is between the base electrode of transistor 21 and the $+V_{DD}$ terminal 5, and the remainder of this capacitance is between the base electrode and ground, and between the base and emitter electrodes of transistor 21. However, whether or not this model is completely accurate, the problem described below has been found to exist during the operation of the circuit.

When the synchronization pulse is applied at terminal 2, turning on transistors 20 and 21, the distributed capacitance at the base electrode of transistor 21 has been found to take on a charge which is relatively positive at the base electrode. It has also been found that when the synchronization pulse is terminated, the parasitic capacitance tends to maintain the base of transistor 21 at this positive level which is close to $V_{DD}$. As a result, when node 300 drops $1V_{be}$ below $+V_{DD}$, transistor 21 turns on, and additional charge current is supplied to timing capacitor 27, through the collector-emitter current path of transistor 21, slowing the discharge of capacitor 27 through resistor 28. As shown in waveform B of FIG. 2, when the synchronization signal goes low, the voltage waveform at node 300 should exponentially decay in the manner shown by the dashed line. However, because of the effect of the parasitic capacitance, the voltage at the node 300 instead follows the solid exponential curve and reaches the critical level an interval of time $t_e$ later than it should.

The phase delay $t_e$ is substantially reduced in the circuit of the present invention by the transistorized switching circuit 3 which includes an NPN transistor 4, and an NMOS transistor 6. NPN transistor 4 is connected at its base electrode to the base electrode of NPN transistor 21 (this connection point is common to the parasitic capacitance), at its collector electrode to terminal 5, and at its emitter electrode to the drain electrode of NMOS transistor 6. NMOS transistor 6 is connected at its gate electrode to the output terminal of inverter 19, and at its source electrode to a point of reference potential 7, in this case ground.

With circuit 3 present, when the synchronization signal or pulse A' is applied at terminal 2, causing a low signal to be supplied along line 200, PMOS transistor 20 and NPN transistor 21 are driven into heavy conduction, the multivibrator is placed in its inactive state, and the various parasitic capacitances assume charges such that the base electrode is at substantially $+V_{DD}$, as already described. NMOS transistor 6 is cutoff, as is NPN transistor 4.

When the synchronization pulse is terminated (goes low), the signal along line 200 goes high, cutting off PMOS transistor 20, which in turn cuts off NPN transistor 21. The high signal also turns on NMOS transistor 6, providing a low impedance path between the emitter electrode of NPN transistor 4 and ground. This places the base electrode close to ground potential and, in the process discharges any distributed capacitance between the base electrode of transistor 21 and ground, and is believed also to charge any distributed capacitance which is present between the base electrode and $V_{DD}$ terminal 5. The concurrent discharge and charging current of the parasitic capacitances undirectionally flows through the low impedance current path including the base emitter junction of transistor 4, and the drain-to-source conduction path of NMOS transistor 6. This current flow continues until the voltage across the base electrode of transistor 4 reduces to a level below $1V_{be}$ (roughly 0.6 volts) of transistor 4. At that time transistor 4 cuts off, automatically terminating operation of switching circuit 3. The automatic opening of this low impedance path 4, 6 is an important attribute of the present arrangement because it automatically opens the path between $V_{DD}$ terminal 5 and ground. Thus, after the parasitic capacitances have been appropriately charged and discharged, no power is needed for circuit 3.

Figure 3:
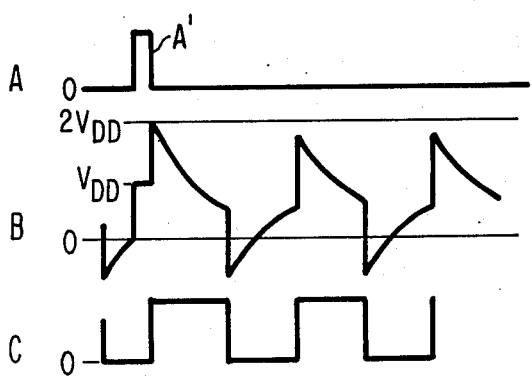
FIG. 3 is a drawing of the waveforms of the complete circuit of FIG. 1.

FIG. 3 illustrates the performance of the circuit with the switch 3 in place. Note that the first cycle of B is almost of the same duration as the succeeding cycles, indicating that $t_e$ is very small.

What is claimed is:
1. A gated astable multivibrator comprising, in combination:
an oscillator responsive to an input signal when of one value for oscillating and to said input signal when of a second value for turning off;
a synchronization circuit for said oscillator comprising a transistor having base, emitter and collector electrodes connected at its collector electrode to an operating voltage terminal, and at its emitter electrode to a terminal of said oscillator circuit, for connecting that terminal to the operating voltage terminal when said transistor conducts, for reducing the time required for the oscillator to synchronize to said input signal;
means responsive to said input signal when of said second value for connecting said base electrode to said operating voltage terminal for turning said transistor on;
a low impedance path comprising the series connection of a semiconductor junction and the conduction path of a MOS transistor; and
means responsive to said input signal when of said one value for disconnecting said base electrode from said operating voltage terminal and for effectively connecting said low impedance path between said base electrode and a point of reference potential, said means including means for turning on said MOS transistor.

2. A gate oscillator as set forth in claim 1, wherein said low impedance path comprises the base-to-emitter junction of a bipolar first transistor in series with the drain-to-source path of a MOS second transistor, the collector electrode of said first transistor being connected to an operating voltage terminal, the base electrode to the base electrode of the transistor of said synchronization circuit, and the emitter electrode to the drain electrode of said second transistor, the source electrode of said second transistor being connected to a point at a reference potential, and the gate electrode being connected to receive said input signal.

3. An astable multivibrator comprising, in combination:
- a pair of series connected inverters; a NAND gate having a first input terminal connected to receive a synchronization signal, an output terminal connected to provide an input signal to said pair of inverters, and a second input terminal;
- an RC timing and feedback circuit having a resistor coupled between the output terminal of said pair of inverters and the second input terminal of said NAND gate, and a capacitor coupled at one terminal to the common connection of said pair of inverters, and at its second terminal to the second input terminal of said NAND gate;
- a transistor having base, emitter and collector electrodes connected at its collector electrode to an operating voltage terminal and coupled at its emitter electrode to the second terminal of said capacitor;
- means responsive to said synchronization signal when at one level for connecting said base electrode to said operating voltage terminal to thereby turn on said transistor;
- a low impedance path; and
- means responsive to said synchronization signal when at a second level for disconnecting said base electrode from said operating voltage terminal, and for placing said low impedance path between said base electrode and ground.

4. An astable multivibrator as set forth in claim 3, further including:
- first and second transistors having their conduction paths connected in series between said operating voltage terminal and a point of reference potential, said first transistor having a control electrode to emitter electrode path, and said second transistor having a control electrode receptive of said synchronization signal, said low impedance path comprising said control electrode to emitter electrode path of said first transistor in series with the conduction path of said second transistor.

5. In an astable multivibrator as set forth in claim 4, said first transistor comprising a bipolar transistor having a base electrode as said control electrode, a collector electrode connected to said terminal for said voltage source, and an emitter electrode; and said second transistor comprising an MOS type transistor having a gate electrode as said control electrode, a drain electrode connected to the emitter electrode of said first transistor, and a source electrode connected to said point of reference potential.

6. In combination:
- a gated astable multivibrator including an input terminal to which a synchronization signal may be applied which, when of one value, places the multivibrator in its inactive state, and when of a second value, places the multivibrator in its oscillating condition, said multivibrator including an input circuit which includes a parasitic capacitor which charges when said multivibrator is placed in its inactive state, and which charge delays the oscillations of said multivibrator when said synchronization signal is changed from said one to said second value;
- a discharge circuit connected across said capacitor including two series connected switches, one initially closed, the other initially open;
- means responsive to the change in said synchronization signal from said one to said second value for closing said initially open switch, whereby said capacitor discharges through said discharge circuit; and
- means responsive to discharge of said capacitor to a given value for opening said initially closed switch.

7. In combination as set forth in claim 6, said discharge circuit including the conduction path of a transistor serving as said initially open switch, said transistor having a control electrode, and the base emitter junction of a second transistor serving as said initially closed switch; and
- said means responsive to the change in value of said synchronization signal from said one to said second value comprising means for applying a signal to said control electrode for turning said transistor on, and said means responsive to the discharge of said capacitor comprising means directly connecting the base of said second transistor to one terminal of said parasitic capacitor.

* * * * *